United States Patent [19]

Garcia

[11] Patent Number: 4,827,476

[45] Date of Patent: May 2, 1989

[54] SCAN TEST APPARATUS FOR DIGITAL SYSTEMS HAVING DYNAMIC RANDOM ACCESS MEMORY

[75] Inventor: David J. Garcia, San Jose, Calif.

[73] Assignee: Tandem Computers Incorporated, Cupertino, Calif.

[21] Appl. No.: 39,548

[22] Filed: Apr. 16, 1987

[51] Int. Cl.[4] .......................................... G01R 31/28
[52] U.S. Cl. ......................................... 371/25; 371/21
[58] Field of Search ........................... 371/13, 21, 25; 324/73 R, 73 AT; 365/201, 222

[56] References Cited

U.S. PATENT DOCUMENTS

| | | | |
|---|---|---|---|
| 4,049,956 | 9/1977 | Van Veen | 371/21 |
| 4,493,081 | 1/1985 | Schmidt | 371/13 X |
| 4,601,034 | 7/1986 | Sridhar | 371/25 |
| 4,622,668 | 11/1986 | Dancker | 371/21 X |
| 4,654,827 | 3/1987 | Childers | 371/21 X |
| 4,757,503 | 7/1988 | Hayes | 371/21 |

OTHER PUBLICATIONS

IBM TDB, "Embedded Array Test With ECIPT", vol. 28, No. 6, 11/1985, pp. 2376-2378.
"A Survey of Design for Testability Scan Techniques", by E. J. McCluskey, Semicustom Design Guide, Summer 1986, pp. 110-119.

Primary Examiner—Jerry Smith
Assistant Examiner—Robert W. Beausoliel
Attorney, Agent, or Firm—Townsend and Townsend

[57] ABSTRACT

A scan test apparatus is constructed to scan test a digital system having a memory system containing dynamic random access memory (DRAM). The scan test apparatus is given access to the memory system so that test control signals can preset the refresh counter (for the DRAM) and initialize the memory for later testing.

8 Claims, 6 Drawing Sheets

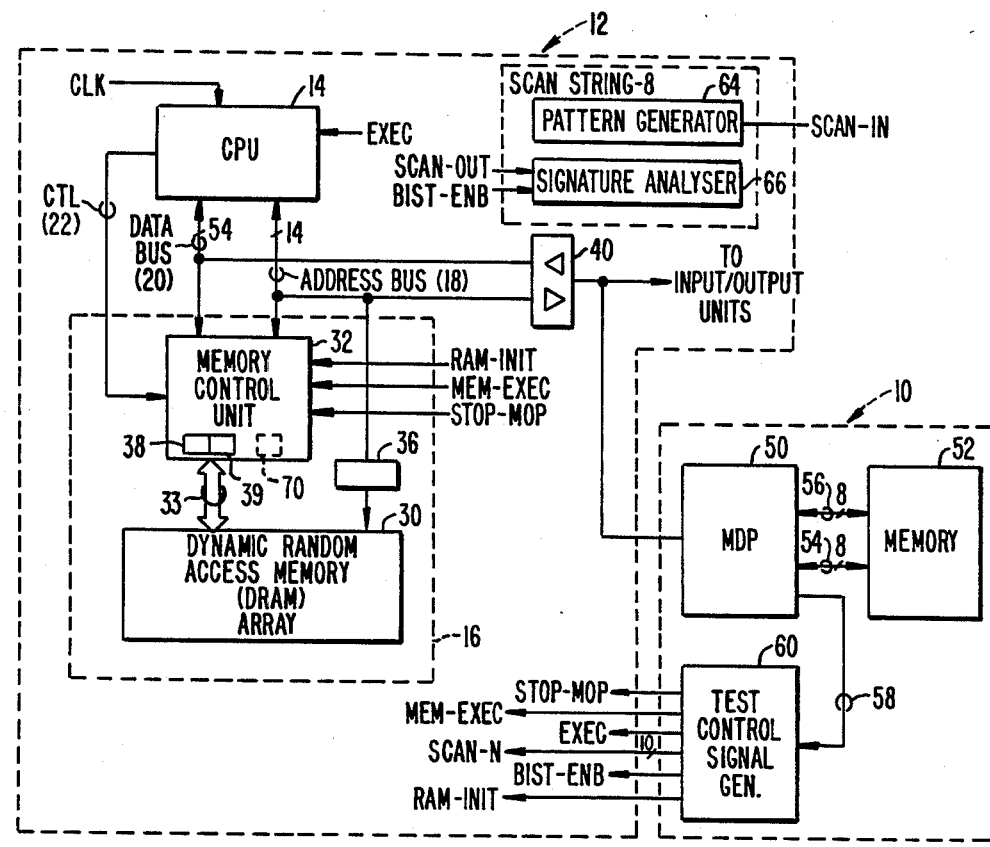
FIG._1.
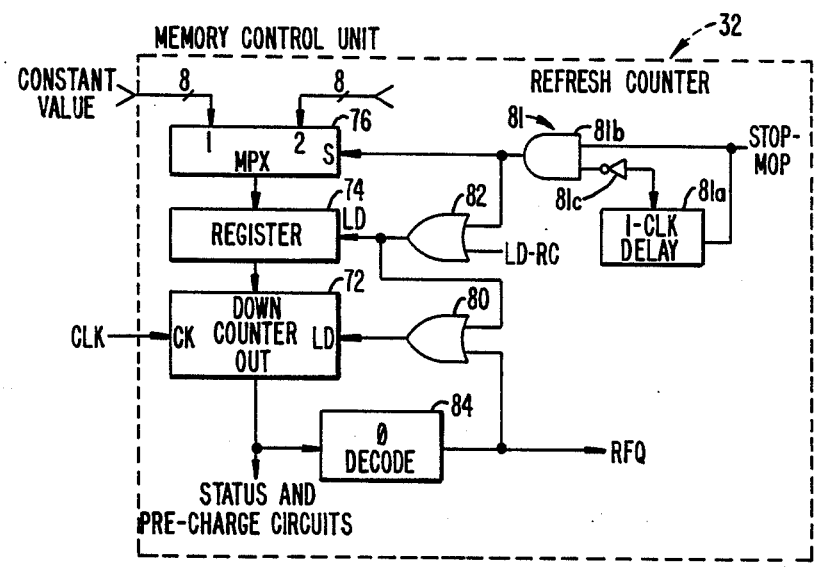
FIG._2.

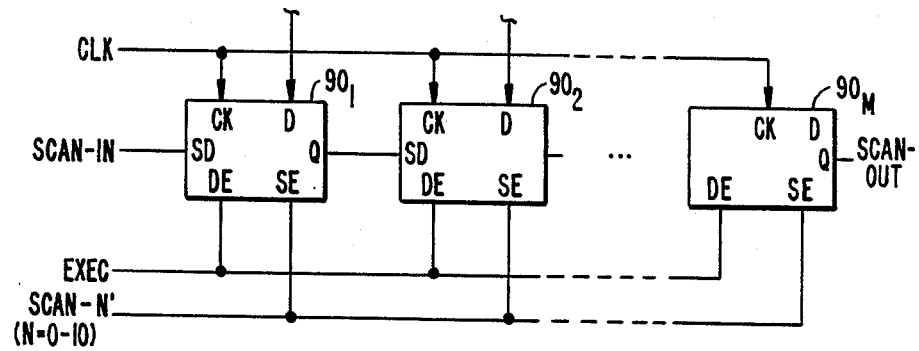
FIG._3.
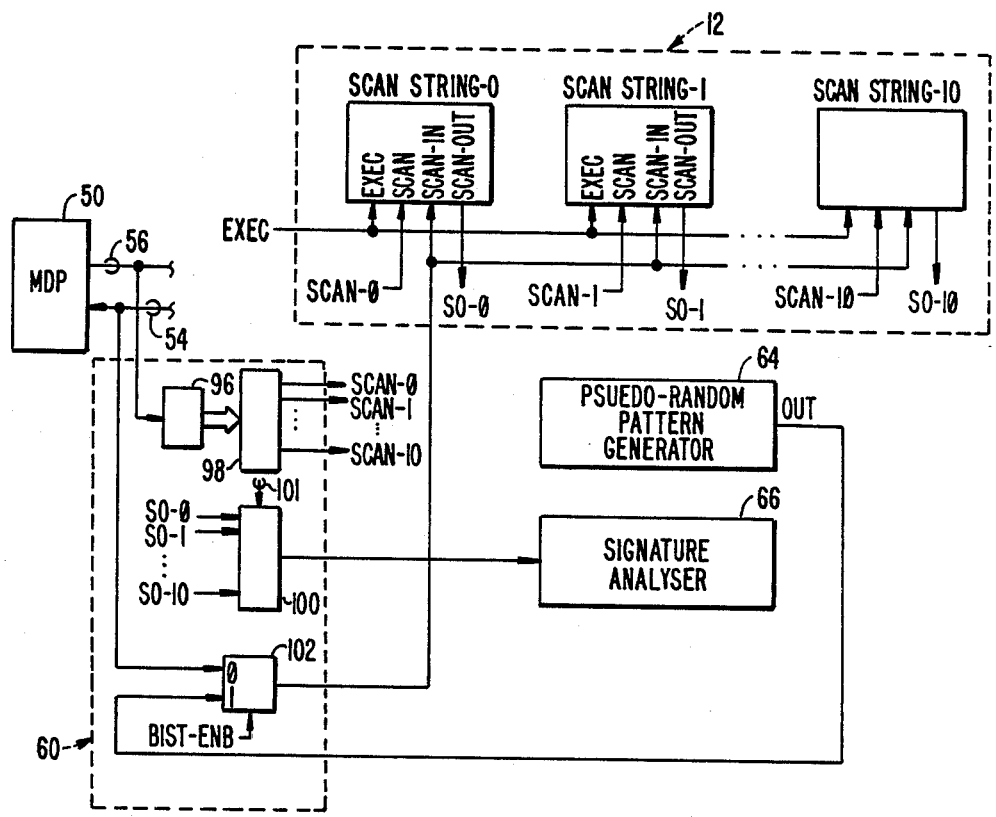
FIG._4.

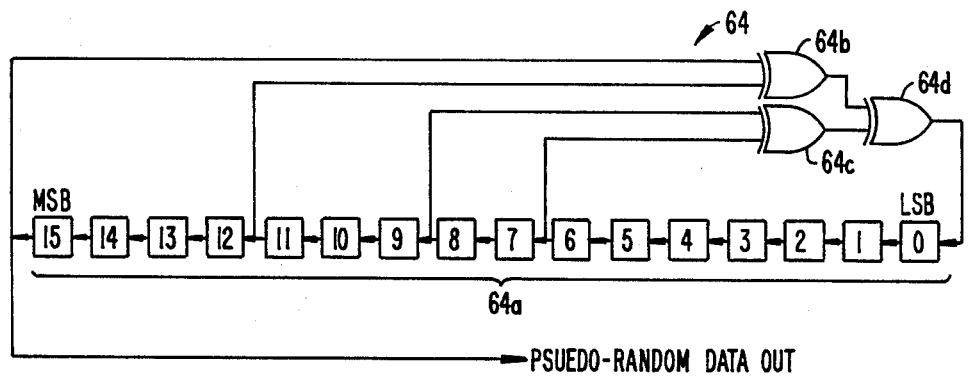
PSUEDO-RANDOM SIGNA GENERATOR
FIG._5.
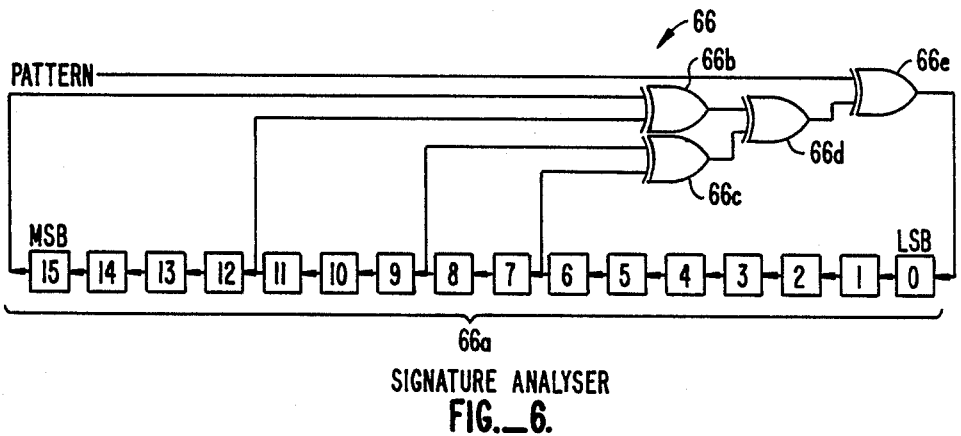
SIGNATURE ANALYSER
FIG._6.
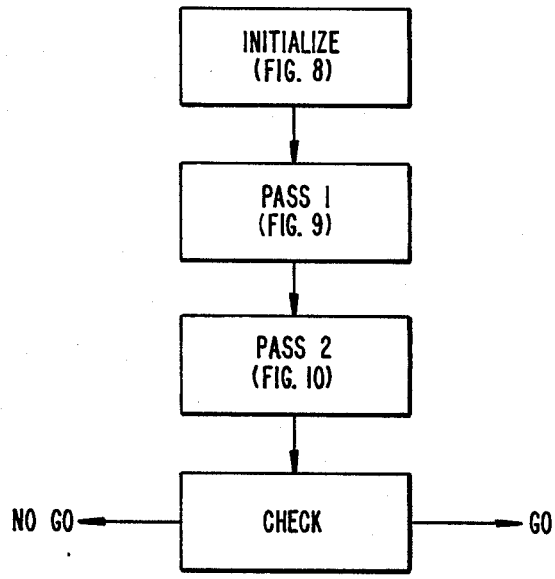
FIG._7.

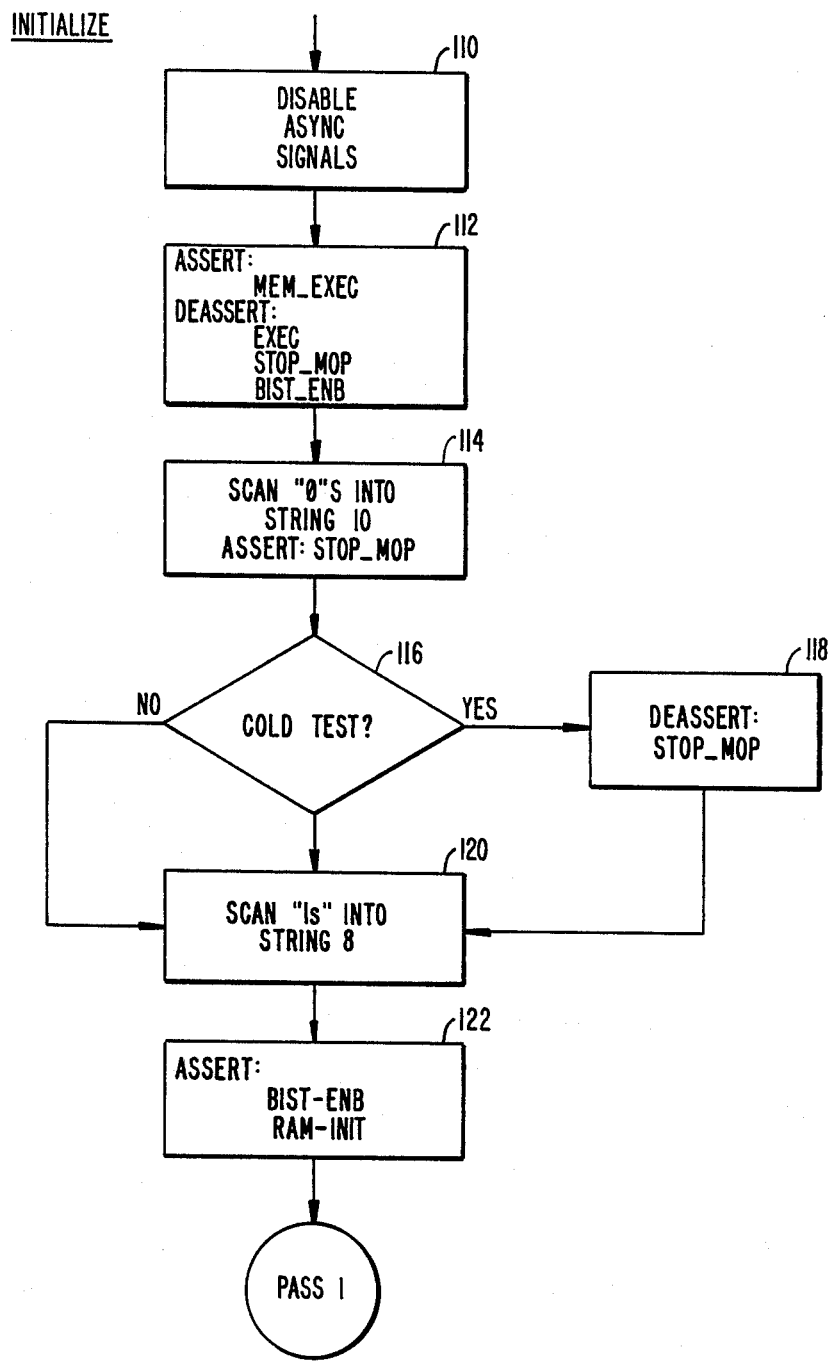
FIG._8.

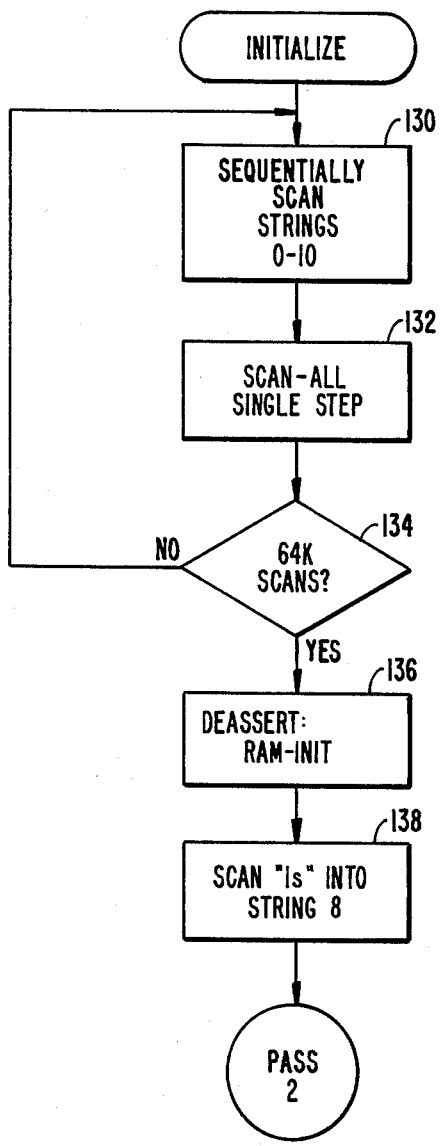
FIG._9.

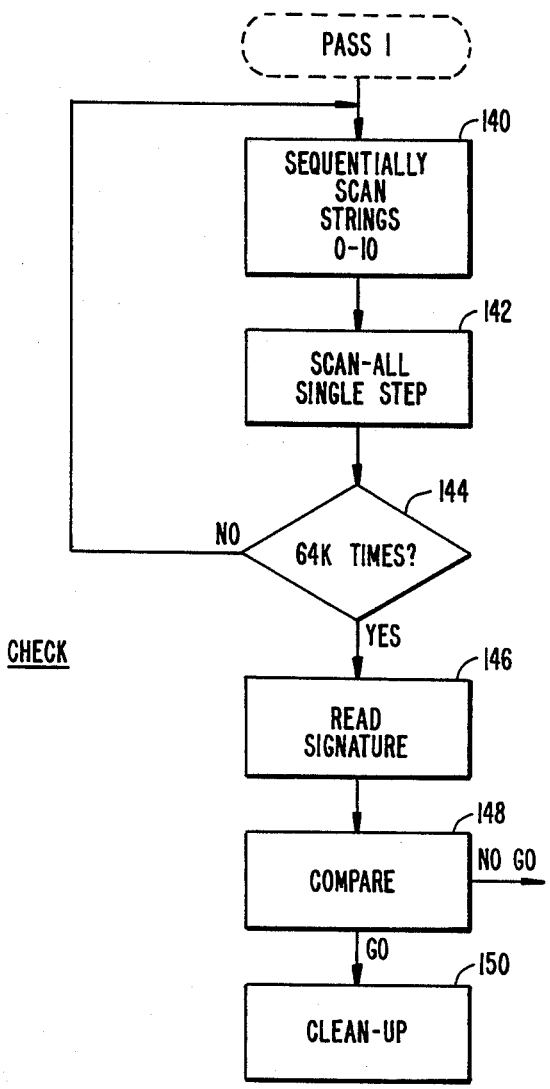
FIG._10.

SCAN TEST APPARATUS FOR DIGITAL SYSTEMS HAVING DYNAMIC RANDOM ACCESS MEMORY

BACKGROUND OF THE INVENTION

The present invention is directed to testing digital logic circuits and systems such as is found in data processing apparatus. The invention relates to scan apparatus that produces sequences of test patterns that are shifted ("scanned") into and out of the system under test, producing result signatures from which can be determined whether or not the system under test will function without fault. In particular, the invention provides apparatus and methods for functionally scan testing a memory system containing dynamic random access memory (DRAM) that may be included in the system under test.

Digital or logic systems have often been tested by applying a variety of test signals to the system, and monitoring the output signals produced in response. Adding to this technique, logic systems have also been designed to incorporate elemental memory stages (i.e., single-bit storage such as flip-flops, latches, and the like) that can be selected to function in one of two modes: A first mode in which they operate as primarily designed (a component in the logic system that operates to receive, store, and pass on system information bits in response to normal logic system control signals): and a second mode in which a number of the elemental memory stages are connected in series to form one or more extended shift registers or, as more commonly referred to in the art, "scan strings." During this second mode, bit patterns, which are typically pseudo-random in nature, are shifted or "scanned" into the scan strings so configured to place the logic system in a pseudo-random state. The logic system is returned to its first mode configuration and permitted to operate for one clock. The logic system is then returned to the second mode and the results extracted from the logic system (again by scanning) and analyzed to determine the operability of the stages and interconnections of the logic system. This testing technique is usually referred to as "scan testing."

Among the underlying principles of scan testing is that the test must be repeatable in the sense that each time a logic system is tested, the same result will be achieved if the system under test is without fault. For this reason, one limitation of scan testing has been the inability to test dynamic random access memories (DRAMs). Such memories require periodic refresh to maintain the information stored. Memory operations, such as read or write accesses, to the memory often are blocked during such refresh intervals. Typically, the intervals are asynchronous in the sense that each time a scan test is initiated, occurrence of the refresh intervals during one test may be different from that of another test. Further, it may be that the length of time of the refresh interval itself is subject to change, so that two different tests will encounter two different refresh intervals. Accordingly: a scan test performed on a digital system that includes a DRAM can produce one result when one test is conducted, and another result when another test is conducted.

These different test results, arising from the asynchronous nature of DRAMs, stems from the following: Typically, when a memory operation is requested (e.g., read or write) of a DRAM during refresh, the DRAM cannot respond: the refresh interval must complete before the DRAM is able to comply with the request. Thus, if during one scan test a read operation is requested. but not honored because of refresh, one result is produced. If the same test is run again later, but this time the same read request is honored, another, different result can be produced.

It is for this reason that scan test schemes do not test DRAMs. As a result, not only is the DRAM left untested, but the circuitry necessary to support DRAM operation is also left unchecked. In short, the entire DRAM memory system is not tested by the scan testing techniques described.

It can be seen, therefore, that in scan testing of the type to which the present invention is directed, there exists a need to be able to, at least, functionally test digital systems having memory systems that include DRAMs of the type described.

SUMMARY OF THE INVENTION

Broadly, the invention is directed to scan test apparatus for testing digital systems having a memory system that contains dynamic random access memory (DRAM). The invention is capable of functionally testing the memory system, including the DRAM and its associated support circuitry. The invention synchronizes the DRAM refresh interval to the test cycle, and initializes the DRAM so that its content is deterministic, albeit pseudo-random.

In the preferred embodiment of the scan, test apparatus of the invention, the digital system to be is constructed to include a DRAM memory system having a refresh counter that is presettable by test control signals produced by the scan test apparatus. At the initiation of testing, the refresh counter is preset with a predetermined value, synchronizing the refresh counter operation to the test cycle. Additional test control signals produced by the test apparatus are given access to the DRAM memory system. During a first portion of the test, the DRAM is prepared by writing pseudo-random (but deterministic) data to those memory locations that may be accessed during a later portion of the test.

There are a number of advantages achieved by the present invention. Digital systems containing DRAMs can be more fully tested on a GO/NO GO basis than before by the capability of functionally testing the memory system DRAMs, including the heretofore untested support circuitry. Synchronizing the DRAMs to the test cycle, and preloading the memory with deterministic values provide this capability.

These and other advantages and objects of the invention will become evident to those skilled in this art upon a reading of the following detailed description, which should be taken in conjunction with the accompanying drawings.

BRIEF DESCRIPTION OF THE DRAWINGS

FIG. 1 is a block diagram representation of the invention with a digital system, in the form of a central processing unit/memory system combination;

FIG. 2 is a block diagram representation of the refresh counter used to establish the refresh interval of the dynamic random access memory (DRAM) shown in FIG. 1;

FIG. 3 is a block diagram illustration of certain elemental storage elements, and their configuration as "scan strings" during a test mode operation;

FIG. 4 is a block diagram illustration of the operational control maintained by the invention during test mode operation;

FIG. 5 is a schematic diagram of the pseudo-random signal generator that is used in connection with the present invention during test mode to provide strings of pseudo-random bit patterns that are used to place the system under test in a pseudo-random state;

FIG. 6 is a circuit diagram of the signature analyzer used to receive the bit patterns from the system under test to develop a signature;

FIG. 7 is a flow diagram illustrating the different phases of the test mode initiated and controlled by the test apparatus of FIG. 1; and FIGS. 8, 9 and 10 are flow diagrams, illustrating the INITIALIZATION, PASS 1 and PASS 2 phases of test mode operation shown in FIG. 7.

DETAILED DESCRIPTION

Referring now to the Figures, and in particular FIG. 1, designated generally with the reference numeral 10 is the scan test apparatus of the present invention shown coupled to a logic or digital system 12 for testing. Here, the system under test is illustrated as including a central processing unit (CPU) 14 coupled to a memory system 16 via address and data buses 18 and 20, respectively.

Although the scan test system 10 could be a stand-alone unit, it is preferable that the scan test system be formed as part of the apparatus that incorporates the digital system 12. The advantage is that tests can be initiated periodically without manual intervention, i.e., under programmed control. For example, a scan test is preferably conducted at power-up ("cold test") to provide assurance of the operability of the digital system 12. There may also be times when the scan test is desired after the digital system 12 has been up and running for a time ("warm test").

As indicated above, an important aspect of the present invention is the ability to functionally test dynamic random access memory (DRAM) and its associated components (support circuitry). Accordingly, FIG. 1 illustrates the system under test as including, in the memory system 16, only a DRAM array 30, although it will be evident to those skilled in this art that the memory system 16 could, indeed, include other forms of memory such as, for example, static random access memory, or read-only memory. It is for simplicity's sake that only a DRAM array 30 (and its associated support circuitry) is shown.

As shown, the memory system 16 includes support circuitry in the form of a memory control unit 32, coupled to the DRAM array 30 by address, data and control lines 33, that contains the necessary control circuits for operating the DRAM array 30, generating the necessary column address strobe (CAS), row address strobe (RAS), and write enable (WE) control signals in the appropriate order, for proper read, write, and other memory operations. The memory control unit 32 includes a first-in, first-out (FIFO) structure 38 and a write FIFO 39, each configured to hold data words read from, or to be written to, the DRAM array 30. The read FIFO 38 holds the data words accessed via a read operation until the CPU 14 can retrieve the accessed data words at its convenience. The write FIFO 39 holds data to be written to memory locations of the DRAM array 30.

As will be seen, the FIFOs 38, 39 form important features of the invention in that they permit, during test mode operation, the memory results to be combined with the scan string results.

The digital system 12 further includes bidirectional driver circuitry 40 that operates under control of the CPU 14 to communicate the address and data buses 18, 20 to interface circuitry for various input/output operations not important to the present invention. It may also communicate the address data buses to the test apparatus 10 to give the CPU some control over the test.

Continuing with FIG. 1 the scan test apparatus 10 is shown as including a maintenance diagnostic processor (MDP) 50 and a memory unit 52 (which could be, for example, an electronically erasable programmable read-only memory (EEPROM)). The MDP 50 and its associated memory 52 are operably connected by data and address buses 54, 56.

The MDP 50 controls, via a control bus 58, a test control signal generator 60 that issues the test control signals stop memory operation (STOP-MOP), memory execute (MEM-EXEC). CPU execute (EXEC). SCAN-N, and built-in system test enable (BIST-ENB), and RAM initialize (RAM-INIT). Operation of these signals will be described hereinafter.

As indicated above, the present invention is directed to a digital system 12 of the type containing basic storage elements such as, for example, flip-flops which are then combined to form latches, registers, counters, and the like. The storage elements are specifically designed so that they are capable of being reconfigured, in response to a signal to form a number of extended shift registers during a test mode operation. Referred to herein as scan strings, these shift registers accept the pseudo-random bit patterns produced by the test apparatus 10. Although the actual number of scan strings formed, and the length of those scan strings, is unimportant insofar as the present invention is concerned, for the purposes of the following discussion, the digital system 12 shall be assumed to be configurable into ten scan strings no greater than 256 individual bit stages. As will be evident to those skilled in the art it is the underlying theory that makes the invention operable, not the number of scan strings or their length.

An important feature of the invention is the capability of synchronizing the refresh rate of the DRAM array 30 with the initiation of a test mode, including setting the refresh interval. This is accomplished by permitting the test apparatus 10 access to the refresh counter contained in the memory control unit 32. Referring now to FIG. 2. the refresh counter, designated generally with the reference numeral 70, is shown including a presettable counter 72 constructed to receive the content of a register 74. The down counter 72 operates in response to a system clock (CLK), received at its clock (CK) input to count downward to ZERO.

Information set into the register 74 comes via a multiplexer (MPX) 76 that is controlled by the STOP-MOP test control signal. The register 74 receives at its load (L,D) input the signal developed by OR gate 82 which, in turn results from assertion of the STOP-MOP test signal (via a pulse generator circuit 81) and a load refresh counter (LD-RC) signal developed by the CPU 14. As FIG. 2 illustrates, the STOP-MOP test signal is applied to the input of a two-input AND gate 81b, the second input of which receives the output (inverted by INVERTER 81c) of a one-clock delay circuit 81a. The result of the pulse generator circuit 81 is a one clock (CLK) pulse. LOW-to-HIGH transition of which operates to load the register 74 and, via OR gates 80 and 82, the down counter 72.

The output of the down counter 72 can be used to provide status information, as well as to develop signals for refreshing the DRAM array 30. The output is also applied to a zero decode circuit 84 that develops a refresh request (RFQ) signal when the content of the down counter reaches ZERO. The RFQ signal ultimately initiates the proper sequencing of CAS, RAS and WE signals to the DRAM array 30 to commence a refresh cycle.

During normal (i.e., non-test mode) operation. the test signal STOP-MOP communicated to the refresh counter 70 is unasserted (i.e., LOW). Accordingly, the input 2 of MPX 76, which is a part of the data bus 20, is selected for communication to the register 74. This permits the CPU 14 to establish the refresh interval, if it so desires, by loading information into the register 74, using the LD-RC control signal. As the configuration of OR gates 80 and 82 illustrate, loading the register 74 is accompanied by a presetting of the down counter 72. When preset, the down counter 70 operates to count down therefrom until the content of the counter reaches ZERO, at which time the RFQ signal is asserted for initiating refresh. In addition, the RFQ signal is fed back through the OR gate 80 to act as a load signal that is applied to the load (LD) input of the counter to preset it with the content of register 74. Thereby, another refresh interval is initiated.

When test mode is initiated, the STOP-MOP signal is asserted (i.e., goes HIGH), momentarily creating (via the pulse generator circuit 81) a pulse that selects a predetermined constant value for input to the register 74 and therethrough to down counter 72. Thus, asserting STOP-MOP presets the down counter with a predetermined constant, as well as functioning to synchronize the refresh counter 70 with the test mode operation.

It is not necessarily important that the occurrence of refresh be known during test mode operation; what is important is that the occurrence of the refresh interval occur at the same times every time test mode operation is initiated. Presetting the refresh counter 70 in the manner described accomplishes this result, and, as will be seen, a deterministic, repeatable scan test can be obtained.

As indicated in the discussion with respect to FIG. 1. the control exhibited by the test apparatus 10 operates, in part, to produce control signals that change the normal configuration of the storage elements (flip-flops, latches, etc.) as registers, counters, and the like, contained within the digital system 12 to form a number of extended shift registers or "scan strings." This concept is illustrated in FIG. 3, which shows a scan string N (N identifying one of the scan strings $\emptyset$–1$\emptyset$). FIG. 3 illustrates the scan string N as including a number of the storage elements $90_1, 90_2 \ldots 90_M$ that make up the digital system 12. Each of the storage elements $90_1 \ldots 90_M$ receives the EXEC and one of the SCAN-N signals. SCAN-N', that are applied to the data enable (DE) and scan enable (SE) inputs of each of the storage elements. During normal operation, when the individual storage elements $90_1 \ldots 90_N$ are configured to operate in their primary design (counters, latches, etc.), the EXEC signal is asserted, and the SCAN-N' signal is deasserted. The data applied at the data (D) inputs is accepted when clocked. When the scan string N is to be configured as an extended shift register, the EXEC signal is deasserted to disable the normal data (D) input of each storage element. Until the SCAN-N' signal is asserted, the storage elements $90_1 \ldots 90_M$ are frozen. When SCAN-N' is asserted (with EXEC deasserted), the SD inputs are enabled to, in effect, configure the storage elements $90_1, \ldots 90_M$ as shown in FIG. 3: The scan data (SD) input of the storage element $90_1$ receives the SCAN-IN data; the scan data (SD) input of the storage element $90_2$ receives the Q output of the storage element $90_1$, and so on, as controlled by the clock (CLK) applied to their clock (CK) inputs. This permits the SCAN-IN data to be clocked into the extended shift register configuration. When the configuration is loaded, the SCAN-N' signal is deasserted and the EXEC signal is asserted to permit the configuration of the elements $90_1$–$90_M$ from the extended shift register to normal configuration for one-clock (CLK) pulse. EXEC is then deasserted to return to the configuration of FIG. 3 and the results shifted through the storage elements $90_1, \ldots 90_M$ and out Q output of the last of the line, $90_M$, forming the SCAN-OUT data.

As indicated above, the EXEC test signal operates to freeze portions of the digital system 12; it does not, however, control the memory systems 12. It is the MEM-EXEC test signal that operates, when asserted, to permit memory refresh and memory operations to occur. Were it otherwise, no valid testing of the memory system 16 could be achieved. For example, although the EXEC test signal can be deasserted during scanning, and pulsed HIGH for one-clock (single-step), the MEM-EXEC test signal must remain asserted for two important reasons: First, refresh must continue to keep data stored in the DRAM array 30 alive. Second, once a memory operation is started, it most likely will require several of the system clocks to complete. Pulsing the MEM-EXEC test signal in the manner the EXEC test signal is pulsed would prohibit the conclusion of a memory operation. Turning now to FIG. 4. those features of the test control signal generator 60 (FIG. 1) that operate under control of the MDP 50 for communicating pseudo-random bit patterns to the logic system 12 are illustrated. FIG. 4 also conceptually illustrates test mode configuration of the storage elements of the digital system 12 into the scan strings $\emptyset, 1, \ldots N$ by assertion of the EXEC signal.

As shown, the test control signal generator 60 includes a decoder unit 96 coupled to receive the address bus 56 from the MDP 50. The decoder unit operates to recognize certain addresses communicated on the address bus 56 to set one of a number of registers contained in register unit 98. The particular register set causes one or the other of the SCAN-$\emptyset$, SCAN-1, ..., SCAN-1$\emptyset$ signals to be asserted which, in turn, conditions a corresponding one of the scan strings to receive data at its SCAN-IN data input.

The test control signal generator 60 further includes a multiplex unit 100 which operates to multiplex the individual scan string output signals 50-$\emptyset$, 50-1, ..., 50-1$\emptyset$ to the signature analyzer 66. Selection is established by communicating the SCAN-$\emptyset$, SCAN-1, ... SCAN 1$\emptyset$ outputs from the register unit 98 to the input 101 of the multiplexer 100; each SCAN-$\emptyset$, etc. signal selecting, in turn, a corresponding one of the 50-$\emptyset$, etc. outputs to the signature analyzer 66.

Finally, FIG. 4 shows the test control signal generator 60 as including a multiplexer 102 that is operated by the BIST-ENB signal to select data from the data bus 54 (BIST-ENB not asserted) or the pattern generator 64 (BIST-ENB asserted).

As FIG. 4 shows, when in test mode configuration (EXEC deasserted), the logic system 12 is supplied with data from either the MDP 50 or the pattern generator 64: the MDP selects which portion (i.e., which scan string) of the digital system 12 is to receive the data by writing to an address recognizable by the decoder unit 96 to set one of the registers of register unit 98. When BIST-ENB is not asserted, data is supplied by the MDP 50: if BIST-ENB is asserted, the pattern generator supplies the data - and whatever is in the selected scan string is simultaneously communicated to and received by the signature analyzer 66.

Illustrated in greater detail in FIG. 5 is the pseudo-random pattern generator 64. The pattern generator 64 is constructed as a 16-bit maximum-length linear feedback shift register (LFSR) capable of counting through $2^{16}-1$ states, in a pseudo-random fashion, before repeating itself. It never reaches the all ZERO state. Before use, the pattern generator is seeded with, preferably, an all ONEs value. The pattern generator 64 includes, in addition to the 16-stage left shift register 64a, EXCLUSIVE-OR gates 64b, 64c and 64d, configured to receive predetermined outputs of the shift register 64a as shown.

The signature analyzer 66 is of substantially similar construction (i.e., it also is an LFSR) including a left shift register configuration 66a, having 16 register stages, and EXCLUSIVE-OR gates 66b, 66c, 66d, and 66e configured to receive the scan pattern from the individual scan lines (FIG. 4), and designated register stage outputs (to achieve the LSFR configuration) to develop therefrom an ultimate bit pattern ("signature") indicative of a GO/NO GO test.

Having now described the essential elements of the invention, operation of the invention can now be discussed with reference specifically to the flow diagrams of FIGS. 7-10, beginning first with FIG. 7.

FIG. 7 is an overview of the scan test operation controlled by the scan test apparatus 10, illustrating the major scan test stages, INITIALIZE, PASS 1. PASS 2 (illustrated in greater detail in FIGS. 8, 9 and 10, respectively), and CHECK (also illustrated in FIG. 10).

The testing performed by the scan test apparatus 10 on the digital system 12 is not designed to do anything more than to provide assurance that the digital system 12 is operable. To do this, scan testing of the type to which the present invention is directed has as a goal to exercise every data path in the system 12. Testing is accomplished by using the extended shift register configurations (scan strings) to set the digital system 12 in a pseudo-random state. This is done by scanning into the scan strings a serial stream of pseudo-random bits. The digital system 12 is then allowed to return to its normal configuration for one clock, and then placed again in the test mode configuration. The results of this operation are scanned out while at the same time a new pseudo-random state is scanned in. This is repeated enough times ($2^{16}$ or 65,536 times, for example) to ensure that the circuits and paths of the digital system 12 are exercised as completely as possible. The data patterns retrieved from the digital system 12 can be combined in various ways to produce a "signature" that can be compared to a standard signature, usually developed by running the same test on a digital system known to be free of fault.

It can be seen, therefore, that a hallmark of this type of testing technique is that the test be repeatable. This requires the test to start with the system 12, including the memory system 16, in a deterministic state; that is, the same state every time the test is initiated. That is the purpose of the INITIALIZE and PASS 1 stages of the test procedure. At the end of the INITIALIZE and PASS 1 stages, the digital system 12, for the most part, is prepared for scan testing.

During PASS 2, the individual storage elements of the system 12, and their interconnections, are exercised and the signature developed. The PASS 2 stage ends with a result from which a GO/NO GO determination can be made.

FIG. 8 illustrates the INITIALIZE stage in greater detail, which is entered via step 110 where any asynchronous signal sources (e.g., externally produced interrupts, I/O signals, etc.) that can disrupt the digital system 12 are disabled so that, during test, they cannot occur. At step 112, the MEM-EXEC signal is asserted (if it has not been asserted previously) to permit memory refresh operations to occur. At the same time, the following signals are deasserted: EXEC, STOP-MOP, and BIST-ENB. The effect of step 112 is to place the digital system 12 in a test configuration, during which the ten scan strings can be formed in response to assertion of the SCAN-N signals.

To digress a moment, the EXEC signal operates to control CPU 14 operation, enabling the CPU, when asserted, to respond to the CLK signal in synchronous fashion. When the EXEC signal is deasserted, the CPU 14 is disabled, and, as explained above. deassertion of EXEC with assertion of SCAN-N configures the N scan string. The EXEC signal also operates to condition the memory system 16 to ignore memory operation requests so that it (the memory system 16) will not attempt to honor what might appear to be memory requests formed by the pseudo-random patterns being scanned into the digital system 12. Once pseudo-random patterns have been scanned into the digital system 12. the system is "single-stepped;" that is, the EXEC signal is asserted long enough to permit the logic system to respond to one pulse of the CLK signal, EXEC is then deasserted to freeze the results, and the SCAN-N signals again sequentially asserted to scan out the results of the single-step operation while, at the same time, scanning in a new pseudo-random state. It is this scan/step procedure that is repeated 64K (65.536) times - both during the PASS 1 and the PASS 2 stages.

Returning to FIG. 8, and step 112, deassertion of the STOP-MOP signal readies it for presetting the refresh counter 70; it is the rising edge of STOP-MOP assertion that effects presetting. Deasserting BIST-ENB disables the pattern generator 64 and signature analyzer 66 until needed, BIST-ENB, when deasserted. also couples the pattern generator 64 and 66. via appropriate combinatorial logic (not shown) so that they form a part of scan string 8 - as diagrammatically illustrated in FIG. 1.

At step 114, the SCAN-1∅ signal is asserted. with EXEC deasserted, to form the scan string 10, and the MDP produces a string of ZEROs that are scanned into the string. The scan string 10 contains certain of the logic circuitry of the memory control unit 32 of memory system 16, and step 114, therefore, initializes the memory control unit 32 for the upcoming functional test of the memory system 16. The content of the DRAM array 30 is not disturbed at this time.

Step 114 completes with the assertion of the STOP-MOP signal to synchronize the refresh counter 70.

At step 116 a decision is made as to whether a cold test (i.e., one that follows a turn-on procedure of the system 12) is being conducted. If not, the initialize routine proceeds directly to step 120 and STOP-MOP remains asserted to prevent the memory system 16 from responding to memory requests during tests conducted when it is desired that the content of the DRAM array 30 remain intact. If, however, it is a cold test, STOP-MOP will be deasserted in step 118 to permit memory requests to be honored.

In step 120, the scan string 8, which contains the pattern generator 64 and signature analyzer 66, is filled with ONEs. This seeds the pseudo-random pattern generator 64 and signature analyzer 66.

At step 122 the BIST-ENB signal is asserted, to detach from scan string 8, and permit operation of, the pattern generator 64 and signature analyzer 66. Additionally, the RAM-INIT signal is also asserted to force the memory system 16 to treat all read operations as write operations. The reason for assertion of RAM-INIT will become clear after the discussion of the PASS 1 stage, below. Suffice it here to say that assertion of RAM-INIT, which remains asserted during execution of PASS 1, places the DRAM array 30 in a deterministic, albeit pseudo-random, condition that permits scan test of the memory system 16.

Step 122 completes the INITIALIZE stage, and the procedure proceeds to the PASS 1 stage, illustrated in greater detail in FIG. 9.

The INITIALIZE stage (FIG. 8) exits to step 130 of the PASS 1 stage. The EXEC control signal, which was deasserted in step 112 of the INITIALIZE stage. remains deasserted to prohibit the CPU 14 from issuing memory requests, and to permit the sequential assertion of the SCAN∅, . . . , SCAN 9 signals to form the scan line configurations and enable each of the scan strings ∅–1∅ so formed to receive pseudo-random bit patterns produced by the pattern generator 64. The bit patterns are clocked in by the system clock (CLK) signal that is applied to the clock (CK) inputs of the storage elements.

The actual number of bits of pseudo-random data that are scanned, or shifted, into the scan strings is not material, as long as they are all filled. Accordingly, if the longest scan string is 256 stages, and the remaining scan strings are equal to or less than that number, it is sufficient if there are at least 256 clocks applied to each of the scan strings. What is important, however, is that the digital system 12 be capable of repeatedly being placed in the same pseudo-random state each time the scan test is performed.

Returning to FIG. 9, once each of the individual scan strings has been filled with pseudo-random data the MDP initiates a scan all-single step operation: All SCAN ∅. . . . , SCAN ∅ signals are asserted simultaneously for one-clock (CLK) cycle, and then deasserted. The single step operation is then performed by asserting EXEC for one cycle of CLK. By shifting all the bits of the digital system 12 via the scan-all step, preceding the single step, many tight timing paths of the digital system 12 are exercised, allowing the scan test operation to cover timing faults as well.

The PASS 1 state resumes by returning to step 130, and repeating that step, as well as step 132. In short, steps 130, 132 and 134 are repeated $2^{16}$ times.

It will be remembered that the RAM-INIT signal was asserted before PASS 1 was entered (FIG. 8, step 122) and has remained asserted during the $2^{16}$ times steps 130, 132 and 134 were executed. As previously mentioned, assertion of the RAM-INIT causes all read commands to the memory system 16 to be executed as write commands. During any of the single step operations of step 132, the EXEC signal is asserted, and (if STOP-MOP is deasserted, i.e., this is a cold start test) the memory system 16 is able to honor memory write requests. Thus, if the pseudo-random state of the digital system 12 forms a read (or a true write) command on the CTL lines 32, a pseudo-random bit pattern is written to the memory location defined by the pseudo-random bit pattern forming the memory address. As will be seen, steps 130 132 and 134 are repeated in PASS 2 (as steps 140, 142 and 144 - FIG. 10), but with the RAM-INIT signal deasserted. This will enable all read commands to be executed by the memory 16, which will then read the pseudo-random bit pattern written to the location during PASS 1. In short, a deterministic result is repeatably obtained.

When the $2^{16}$ scan, scan-all, and single step operations of PASS 1 have been completed, the RAM-INIT signal is deasserted in step 136, to thereafter permit read requests to the memory system 16 to be handled normally. In step 138 all ONEs are scanned into the scan string 8 to again seed the pattern generator 64 and signature analyzer 66 preparing them. The digital system 12, including the memory system 16 and the DRAM array 30, is now ready for the actual test, which is performed in the PASS 2 stage.

The first three steps 140, 142 and 144, of PASS 2 are essentially identical to the steps 130, 132, 134 of PASS 1, as indicated above, except that the RAM-INIT signal is deasserted. The read operations that occurred during PASS 1, will occur again during PASS 2, but since RAM-INIT is deasserted they will be executed as read operations rather than write operations. The pseudo-random data placed at the (pseudo-randomly identified) DRAM location during PASS 1 is accessed and placed in the read FIFO to await a subsequent retrieval request (again, formed by the pseudo-random bit patterns) from the CPU 14. The FIFO, therefore, provides the memory systems 16 access to the bit patterns extracted from the logic system 12 (during the scan operations) so that the results of test mode operation of the memory system can be included in the signature generated by signature analyzer 66.

The completion of the $2^{16}$ scan/single step steps concludes the PASS 2 stage, with the signature analyzer 64 containing the results of the entire test procedure in the form of a 16-bit signature. The content of the signature analyzer 64 is read into the MDP 50 (by operating scan string 8 for 16 clocks) in step 146, and compared, at step 148, with a standard value. (Steps 146, 148, and 150 (FIG. 10) form the CHECK stage illustrated in FIG. 7.) If the comparison is good, the PASS 2 stage finishes with a clean-up step 150 in which certain of the logic elements of the step 12 are placed in more deterministic states (using the scan routines previously described) to return control of the digital system 12 to the CPU 14.

If, on the other hand, the compare step 148 finds that the signature produced in PASS 2 does not match that previously provided, a NO GO indication is provided.

The standard is developed empirically, by running the test (i.e., the INITIALIZE, PASS 1 and PASS 2 stages) on a digital system 12 that is known to be operational and without fault). The signature developed is then used as a standard, and stored in a read-only memory section of the memory 52.

To summarize the foregoing disclosure, test apparatus has been disclosed capable of testing a digital system 12 that includes a memory system 16 having a dynamic random access memory 30. Important is the fact that the memory refresh counter is preset by the assertion of the STOP-MOP signal at the initiation of testing with a predetermined value. It is not important that the test apparatus 10 know exactly when the refresh intervals occur, but that they occur in deterministic fashion during the test. It is also not important as to the value used to preset the refresh counter, as long as it is a value that establishes a refresh interval sufficient to maintain the DRAM array 30.

The need to preset the refresh counter with a predetermined value arises from the fact that the CPU also has access to the refresh counter. Thus, one refresh value could produce a test signature different from that produced by another value. The reason for this stems from the possible asynchronous operation of the refresh interval, relative to the test cycle. For example, if, during either PASS 1 or PASS 2, a read memory operation is called for during one of the 2 single step operations (step 132, 142), but allowed to happen during another test cycle, it can be seen that different signatures quite possibly will be developed, giving erroneous error indications. Synchronizing the refresh interval to the test cycle ensures that every memory operation will produce the same results every time the test is conducted.

I claim:

1. Test apparatus for scan testing a digital system of the type including a memory system containing a dynamic random access memory (DRAM) having a refresh interval established by a refresh counter means, the test apparatus comprising:
   processor means operably coupled to the digital system for initiating a test mode during which the processor means produces a plurality of test signals that repeatably place the digital system in a pseudo-random state and retrieve from the digital system an indicia of the operability of the digital system, and
   means coupling first ones of the test signals to the refresh counter means to operably set said refresh counter to establish a predetermined refresh period that is synchronous with the test mode.

2. The test apparatus of claim 1, including generator means operable to provide a pseudo-random bit pattern; first circuit means operable to communicate the pseudo-random bit pattern, under processor means control, to the digital system to place the digital system in the pseudo-random state; second circuit means, operable under processor means control, to substantially extract the pseudo-random state from the digital system to form therefrom the indicia of the operability of the digital system.

3. The test apparatus of claim 2, including means for comparing the indicia to a predetermined value to determine therefrom the operability of the digital system.

4. The test apparatus of claim 1, including:
   test means, operable in a first mode under processor means control, to repeatably place the digital system in a pseudo-random state a first predetermined number of times;
   means coupling certain of the test signals to the memory system to force all read memory operations to memory write operation during the first mode;
   the test means being further operable in a second mode under processor means control to repeatably place the digital system in a pseudo-random state a second predetermined number of times; and
   means for removing the pseudo-random state during the second mode to develop therefrom indicia of operability of the digital system;
   wherein the certain of the test signals permit read memory operations during the second mode.

5. Test apparatus for scan testing a digital system of the type having a memory system containing dynamic random access memory (DRAM) with a refresh interval established by a refresh counter means and being operably configurable from a normal mode to a test mode to receive and be set to a psuedo-random state, the test mechanism comprising:
   processor means operable to produce a plurality of test control signals that establish the test mode;
   generator means coupled to the digital system for supplying pseudo-random bit pattern thereto;
   circuit means coupling certain of the test control signals to the refresh counter means to establish a predetermined refresh interval and synchronize the refresh interval with initiation of the test mode.

6. The apparatus of claim 5, wherein the refresh counter means is operable to be preset with a value that establishes the refresh interval, and wherein the synthronizing means includes means for presetting the refresh counter with a predetermined value.

7. Scan test apparatus for testing a digital system of the type including a dynamic random access memory (DRAM) having a refresh interval established by a refresh counter means and a plurality of static memory elements, certain of the memory elements being configurable in response to a scan signal to form at least one extended serial shift register means having an input terminal and an output terminal, the test apparatus comprising:
   processor means operable to initiate a test mode in which is produced a number of test signals, including the scan signal;
   means responsive to at least one of the test signals for synchronizing the refresh interval to the initiation of the test mode;
   means responsive to certain of the test signals to produce pseudo-random bit patterns;
   means responsive to other of the test signals to selectively couple the pseudo-random bit patterns to the input terminal of the extended shift register means; and
   signature generating means coupled to the output terminal of the extended serial shift register means for receiving bit patterns therefrom during the best mode and generating from said bit patterns a value indicative of operability of the digital system.

8. A method of scan testing a digital system of the type having a memory system containing a dynamic random access memory having a refresh interval established by a refresh counter means, the method comprising the steps of:
   synchronizing the refresh counter means with the initiation of a scan test mode of operation;
   operating in a first mode to repeatably place the digital system in a first number of separate pseudo-random states;
   controlling the memory system during the first mode to cause all memory read operations to be effected as memory write operations by the memory system;
   operating in a second mode to repeatably place the digital system in a second number of pseudo-random states; and
   during the second mode, extracting each one of the pseudo-random states from the digital system and forming therefrom indicia representative of the operability of the digital system.

* * * * *